(12) United States Patent
Takeda et al.

(10) Patent No.: US 8,916,931 B2
(45) Date of Patent: Dec. 23, 2014

(54) LDMOS SEMICONDUCTOR DEVICE WITH PARASITIC BIPOLAR TRANSISTOR FOR REDUCED SURGE CURRENT

(75) Inventors: Yasuhiro Takeda, Ora-gun (JP); Seiji Otake, Kumagaya (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 93 days.

(21) Appl. No.: 13/286,832

(22) Filed: Nov. 1, 2011

(65) Prior Publication Data

US 2012/0112240 A1     May 10, 2012

(30) Foreign Application Priority Data

Nov. 5, 2010   (JP) ................. 2010-248113

(51) Int. Cl.
*H01L 29/772*     (2006.01)
*H01L 29/78*      (2006.01)
*H01L 29/08*      (2006.01)
*H01L 29/10*      (2006.01)

(52) U.S. Cl.
CPC ........ *H01L 28/7816* (2013.01); *H01L 29/7823* (2013.01); *H01L 29/0873* (2013.01); *H01L 29/0878* (2013.01); *H01L 29/1083* (2013.01); *H01L 29/1087* (2013.01); *H01L 29/1095* (2013.01); *H01L 29/7835* (2013.01)
USPC .......... 257/343; 257/335; 257/342; 257/409; 257/494; 257/495; 257/E29.256; 257/E29.264

(58) Field of Classification Search
CPC ............ H01L 29/0619; H01L 29/0623; H01L 29/7801; H01L 29/7816; H01L 29/0603; H01L 29/0607; H01L 26/0615; H01L 29/0626; H01L 29/063; H01L 29/0634; H01L 29/0638; H01L 29/0642; H01L 29/0646; H01L 29/1083; H01L 29/1087; H01L 29/36

See application file for complete search history.

(56) References Cited

U.S. PATENT DOCUMENTS 6,747,294 B1 *  6/2004  Gupta et al. ................. 257/127
6,765,247 B2    7/2004  Beasom
6,902,967 B2    6/2005  Beasom

FOREIGN PATENT DOCUMENTS

JP   2004-247400   9/2004
JP   2005-507164   3/2005

* cited by examiner

*Primary Examiner* — Julio J Maldonado
*Assistant Examiner* — Molly Reida

(57) ABSTRACT

An N type layer made of an N type epitaxial layer in which an N+ type drain layer etc are formed is surrounded by a P type drain isolation layer extending from the front surface of the N type epitaxial layer to an N+ type buried layer. A P type collector layer is formed in an N type layer made of the N type epitaxial layer surrounded by the P type drain isolation layer and a P type element isolation layer, extending from the front surface to the inside of the N type layer. A parasitic bipolar transistor that uses the first conductive type drain isolation layer as the emitter, the second conductive type N type layer as the base, and the collector layer as the collector is thus formed so as to flow a surge current into a ground line.

20 Claims, 11 Drawing Sheets

LDMOS SEMICONDUCTOR DEVICE WITH PARASITIC BIPOLAR TRANSISTOR FOR REDUCED SURGE CURRENT

CROSS-REFERENCE OF THE INVENTION

This application claims priority from Japanese Patent Application No. 2010-248113, filed Nov. 5, 2010, the content of which is incorporated herein by reference in its entirety.

BACKGROUND OF THE INVENTION

1. Field of the Invention

The invention relates to a semiconductor device, in particular, an LDMOS transistor in which a regenerative current or an on-state current of a parasitic bipolar transistor flowing toward the semiconductor substrate is decreased.

2. Description of the Related Art

An LDMOS transistor has higher and more stable switching performance and thus it is easier to use than a bipolar type power transistor, as well as IGBT. Therefore, it is widely used in an inverter circuit of a switching power supply or a lighting device such as a DC-DC converter, an inverter circuit of a motor, and so on. An LDMOS is an abbreviation of Lateral Double Diffused Metal Oxide Semiconductor and means a lateral double-diffused gate MOS.

Among various structures of LDMOS transistors, there is a general LDMOS transistor in which a P type body layer including an N+ type source layer and an N type drift layer including an N+ type drain layer are formed in one of regions in an N type epitaxial layer deposited on a P type semiconductor substrate through an N+ type buried layer, the regions divided by P+ type isolation layers (hereafter, referred to as an ordinary type LDMOS transistor).

A negative voltage, that is generally called a counter-electromotive force, occurring in an inductance load (hereafter, referred to as an L load) such as a motor or the like at the time of a power supply turn-off operation may sometimes be applied to the N+ type drain layer of this LDMOS transistor. At this time, a PN junction formed between the N+ type buried layer and the P type semiconductor substrate becomes forward-biased. Therefore, a so-called regenerative current flows from the N+ drain layer to the P type semiconductor substrate, causing a noise or a faulty operation of the control circuit. A method of preventing such a faulty operation is disclosed in Japanese Patent Application Publication No. 2004-247400 and No. 2005-507164.

When a large negative voltage is applied to the N+ type drain layer, there may also occur a turn-on operation of a parasitic NPN bipolar transistor that uses the N type epitaxial layer as the emitter, the P type semiconductor substrate as the base, and the next N type epitaxial layer etc divided by the P+ type isolation layer as the collector, as well as a regenerative current flow described above.

Furthermore, when the bases and collectors of this parasitic NPN bipolar transistor and an internal parasitic PNP bipolar transistor are connected respectively, both the transistors form a parasitic thyristor. In this case, a leakage current of this parasitic thyristor continues increasing, causing the thermal destruction of the LDMOS transistor at last.

In order to avoid a parasitic thyristor operation problem, an LDMOS transistor as shown in FIG. 3 in which an N+ type drain layer 13, an N type drift layer 8 and an N type epitaxial layer 5 (Hereafter, the three layers will be referred to as a drain region together.) are surrounded by a P type drain isolation region 6 and this drain region is completely isolated from a P type semiconductor substrate 1 is developed and mass-produced. Hereafter, the description will be continued referring to this LDMOS transistor as a drain isolated type LDMOS transistor.

There exists a parasitic thyristor S in the drain isolated type LDMOS transistor as shown in FIG. 3. However, the on-state operation of this parasitic thyristor S is prevented since an N type layer 5b made of the N type epitaxial layer 5 between the P type drain isolation layer 6 surrounding the drain region and a P type element isolation layer 3 is connected to a ground line through an N+ type guard ring layer 15.

The P type semiconductor substrate 1 as the emitter of the parasitic PNP bipolar transistor that forms the parasitic thyristor S is connected to the ground line, the N+ type buried layer 2 as the base is connected to the ground line through the N type layer 5b and the N+ type guard ring layer 15. Therefore, the parasitic PNP bipolar transistor does not turn on.

However, Japanese Patent Application Publication No. 2004-247400 is directed to only a case where a large negative voltage is applied from a motor load, and does not take account of a case where a large positive voltage is applied to the N+ type drain layer 13. When a large positive voltage is applied to the N+ type drain layer 13 shown in FIG. 3 by some occasion, for example, from an L load at the time of a power supply on/off operation or due to static electricity, capacitive coupling between the N type layer 5a made of the N type epitaxial layer 5 in the drain region and the P type drain isolation layer 6 may cause the P type drain isolation layer 6 to become positive potential.

The P type drain isolation layer 6 may also become positive potential due to hot electrons accelerated by a strong electric field occurring by a large positive voltage inputted to the N+ type drain layer 13. In this case, there occurs the on-state operation of the parasitic PNP bipolar transistor T1 shown in FIG. 3 that uses the P type drain isolation layer 6 as the emitter, the N type layer 5b connected to the ground line as the base, and the P+ type element isolation layer 3 as the collector. As a result, a large current flows from the N+ type drain layer 13 into the P type semiconductor substrate 1, causing problems such as a noise, a faulty operation of the control circuit and so on.

In order to prevent this, as shown in FIG. 2, a high concentration N+ type sinker layer 21 is formed so as to extend from the front surface of the N type epitaxial layer 5 where the N+ type guard ring layer 15 is formed to inside the N+ type buried layer 2. Thus, the base resistance of the parasitic PNP bipolar transistor T2 is decreased, the base-emitter voltage is decreased, and thus the on-state operation of the parasitic PNP bipolar transistor T2 is difficult to occur.

When the N+ type sinker layer 21 is formed, phosphorus (P) or the like is thermally diffused in a high temperature furnace for a long time until it extends into the N+ type buried layer 2. At this time, phosphorus (P) or the like is thermally diffused extending in the lateral direction, too, the N+ type sinker layer 21 occupies most of the width of the surface region of the N type layer 5b, and thus the die size increases.

Therefore, it is necessary to realize a drain isolated type LDMOS transistor that prevents an on-state operation of a parasitic PNP bipolar transistor and prevents an unnecessary surge current flowing from the N+ type drain layer 13 into the P type semiconductor substrate 1 without increase in the die size. Furthermore, it is necessary to realize an ordinary type LDMOS transistor of which the size is the same as that of a drain isolated type LDMOS transistor or smaller and a regenerative current is decreased.

SUMMARY OF THE INVENTION

The invention provides a semiconductor device including: a semiconductor substrate of a first general conductivity type;

an epitaxial layer of a second conductive type formed on the semiconductor substrate; an buried layer of the second general conductivity type formed in a boundary region between the semiconductor substrate and the epitaxial layer; an element isolation layer of the first general conductivity type formed in the epitaxial layer; a drift layer of the second general conductivity type formed in a surface portion of the epitaxial layer surrounded by the element isolation layer; a drain layer of the second general conductivity type formed in a surface portion of the drift layer; a drain isolation layer of the first general conductivity type formed in the epitaxial layer so as to surround the drift layer and the drain layer; a collector layer of the first general conductivity type formed in a surface portion of the epitaxial layer between the drain isolation layer and the element isolation layer; a guard ring layer of the second general conductivity type formed in the surface portion of the epitaxial layer so as to surround the collector layer; a body layer of the first general conductivity type formed in the surface portion of the epitaxial layer; a source layer of the second general conductivity type formed in a surface portion of the body layer; a gate insulation film formed on the surface portion of the epitaxial layer; and a gate electrode formed on the gate insulation film.

The invention also provides a semiconductor device including: a semiconductor substrate of a first general conductivity type; an epitaxial layer of a second general conductivity type formed on the semiconductor substrate; an buried layer of the second general conductivity type formed in a boundary region between the semiconductor substrate and the epitaxial layer; an element isolation layer of the first general conductivity type formed in the epitaxial layer; a drift layer of the second general conductivity type formed in a surface portion of the epitaxial layer surrounded by the element isolation layer; a drain layer of the second general conductivity type formed in a surface portion of the drift layer; a collector layer of the first general conductivity type formed in a surface portion of the epitaxial layer between the drift layer and the element isolation layer; a guard ring layer of the second general conductivity type formed in the surface portion of the epitaxial layer so as to surround the collector layer; a body layer of the first general conductivity type formed in the surface portion of the epitaxial layer; a source layer of the second general conductivity type formed in a surface portion of the body layer; a gate insulation film formed on the surface portion of the epitaxial layer; and a gate electrode formed on the gate insulation film.

The invention also provides a semiconductor device including: a semiconductor substrate of a first general conductivity type; an epitaxial layer of a second general conductivity type formed on the semiconductor substrate; an buried layer of the second general conductivity type formed in a boundary region between the semiconductor substrate and the epitaxial layer; an element isolation layer of the first general conductivity type formed in the epitaxial layer; a drift layer of the first general conductivity type formed in a surface portion of the epitaxial layer surrounded by the element isolation layer; a drain layer of the first general conductivity type formed in a surface portion of the drift layer; a collector layer of the first general conductivity type formed in a surface portion of the epitaxial layer between the drift layer and the element isolation layer; a guard ring layer of the second general conductivity type formed in the surface portion of the epitaxial layer so as to surround the collector layer; a body layer of the second general conductivity type formed in the surface portion of the epitaxial layer except between the drift layer and the collector layer, being parallel with the drift layer; a source layer of the first general conductivity type formed in a surface portion of the body layer; a gate insulation film formed on the surface portion of the epitaxial layer; and a gate electrode formed on the gate insulation film.

DETAILED DESCRIPTION OF THE INVENTION

A drain isolated type LDMOS transistor of a first embodiment will be described referring to FIGS. 1 to 5B in comparison with a drain isolated type LDMOS transistor having a conventional structure.

Figure 1:
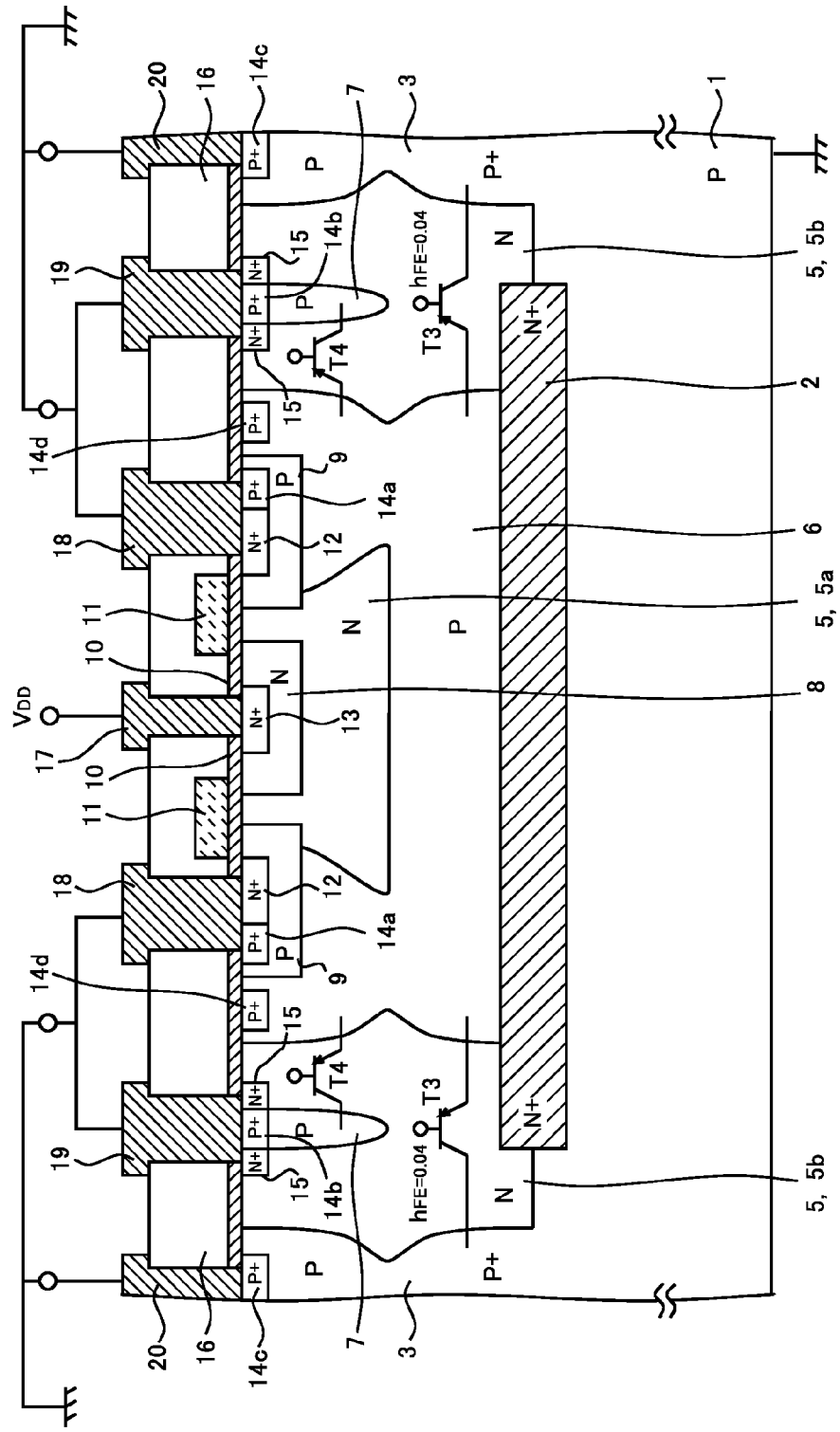
FIG. 1 is a cross-sectional view showing a drain isolated type LDMOS transistor and a method of manufacturing the same of a first embodiment of the invention.
Figure 11A:
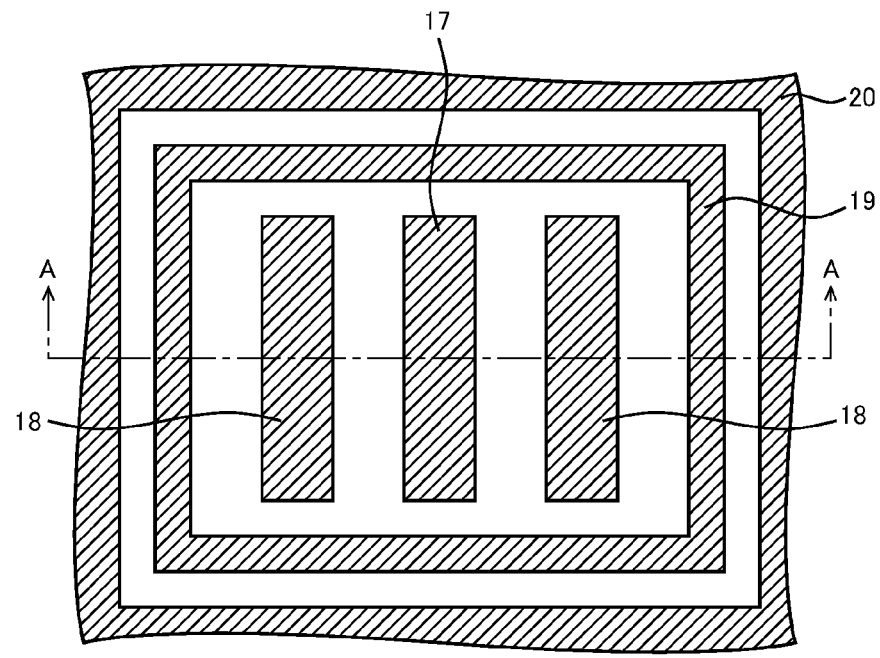
FIGS. 11A and 11B are plan views of the LDMOS transistors of the embodiments of the invention.

In the drain isolated type LDMOS transistor of the first embodiment, a source region including an N+ type source layer 12 is formed symmetrically with respect to a drain region including an N+ type drain 13, as shown in FIG. 1. FIG. 1 is a cross-sectional view showing the drain isolated type LDMOS transistor and a method of manufacturing the same of the first embodiment. FIG. 11A is a schematic plan view of this LDMOS transistor, and FIG. 1 is a cross-sectional view thereof along line A-A. An N type epitaxial layer 5 is formed on a P type semiconductor substrate 1, being divided into a plurality of regions by P type element isolation layers 3. An N+ type buried layer 2 is formed in a boundary region between one of the N type epitaxial layers 5 divided by the P type element isolation layers 3 and the P type semiconductor substrate 1. It is noted that conductivity types such as N+, N and N− belong in one general conductivity type and conductivity types such as P+, P and P− belong in the other general conductivity type.

A P type drain isolation layer 6 is formed in the N type epitaxial layer 5 from on the N+ type buried layer 2 to the front surface of the N type epitaxial layer 5 except in a drain region where the N+ type drain layer 13 etc described below are to be formed, being in contact with the N+ type buried layer 2 except a part near both the ends. As a result, an N layer 5a made of a part of the N type epitaxial layer 5 surrounded by the P type drain isolation layer 6 is formed.

Furthermore, an N type layer 5b made of a part of the N type epitaxial layer 5 is formed between the P type drain isolation layer 6 and the P type element isolation layer 3. In detail, this N type layer 5b is formed in a region surrounded by a region of the N+ type buried layer 2 where the P type drain isolation layer 6 does not exist, an end of the P type drain isolation layer 6, the P type element isolation layer 3, and the P type semiconductor substrate 1. The N type layer 5b has a function of securing a dielectric breakdown voltage between the N+ type buried layer 2 and the P type element isolation layer 3.

An N type drift layer 8 is formed in the front surface of the N type layer 5a and an N+ type drain layer 13 is formed in the front surface of the N type drift layer 8. In detail, the N type drift layer 8 and the N+ type drain layer 13 are formed in a region surrounded by the P type drain isolation layer 6 and completely isolated from the P type semiconductor substrate 1. This is the reason for being called a drain isolated type LDMOS transistor.

Furthermore, a P type body layer 9 is formed extending from inside the P type drain isolation layer 6 to the N type layer 5a, and an N+ type source layer 12 and a P+ type contact layer 14a are formed in the front surface of the P type body layer 9. A gate insulation film 10 is formed extending from on the N+ type source layer 12 onto the N type layer 5a, and a gate electrode 11 is formed on the gate insulation film 10.

As shown in FIG. 1, a P type collector layer 7 is formed in the N type layer 5b, extending from the front surface of the N type layer 5b to the inside, and a P+ type collector layer 14b is formed in the front surface of the P type collector layer 7. The P type collector layer 7 is formed shallower than the N type epitaxial layer 5. An N+ type guard ring layer 15 is formed on the outside of the P type collector layer 7. A P+ type isolation contact layer 14c is further formed in the front surface of the P type element isolation layer 3, and a P+ type drain isolation contact layer 14d is further formed in the front surface of the P type drain isolation layer 6.

Furthermore, a source electrode 18 connected to the N+ type source layer 12 and the P+ type contact layer 14a, a drain electrode 17 connected to the N+ type drain layer 13, a collector electrode 19 connected to the P+ type collector layer 14b and the N+ type guard ring layer 15, and an isolation electrode 20 connected to the P+ type isolation layer 14c are formed through contact holes formed in an interlayer insulation film 16 etc, respectively.

Ordinarily, a supply voltage $V_{DD}$ is applied to the drain electrode 17 through a power supply line $V_{DD}$, and the source electrode 18, the collector electrode 19 and the isolation electrode 20 are grounded. In a case where a large positive voltage is applied to the drain electrode 17 of this drain isolated type LDMOS transistor due to static electricity etc or an L load, the potential of the P type drain isolation layer 6 increases by capacitive coupling by a PN junction formed between the N type layer 5a and the P type drain isolation layer 6.

In other case, a larger voltage than a drain-source dielectric breakdown voltage $BV_{DS}$ is applied to between the N+ type drain layer 13 and the N+ type source layer 12, and thus a depletion layer extends in the N type layer 5a and the N type drift layer 8 toward the N+ type drain layer 13. Electrons injected from the N+ type source layer 12 and running toward the N+ type drain layer 13 are accelerated by a strong electric field in the depletion layer to become hot electrons, activate a silicon lattice in the N type drift layer 8 etc, and generate many electron-hole pairs.

While the electrons of the electron-hole pairs flow in the positive potential N+ type drain layer 13, the holes flow through the P type body layer 9 toward the source electrode 18 into the P+ type contact layer 14a. Some flow into the P+ type contact layer 14a through the P type drain isolation layer 6. At this time, the potentials of the P type body layer 9 and the P type drain isolation layer 6 become positive relative to the ground potential.

As a result, two parasitic PNP bipolar transistors T3 and T4 shown in FIG. 1 may start on-state operations. The parasitic PNP bipolar transistor T3 uses the P type drain isolation layer 6 as the emitter, the N type layer 5b as the base, and the P type element isolation layer 3 as the collector. The parasitic PNP bipolar transistor T4 uses the P type drain isolation layer 6 as the emitter, the N type layer 5b as the base, and the P type collector layer 7 as the collector.

In this case, since the holes tend to flow in the upper portion of the P type drain isolation layer 6 that has a shorter path to the N+ type source layer 12, the holes flow out from the P type collector layer 7 to the collector electrode 19 having ground potential through the parasitic PNP bipolar transistor T4. Therefore, a current that flows from the parasitic PNP bipolar transistor T3 formed below the parasitic PNP bipolar transistor T4 toward the semiconductor substrate 1 through the P type element isolation layer 3 having ground potential is smaller.

Figure 2:
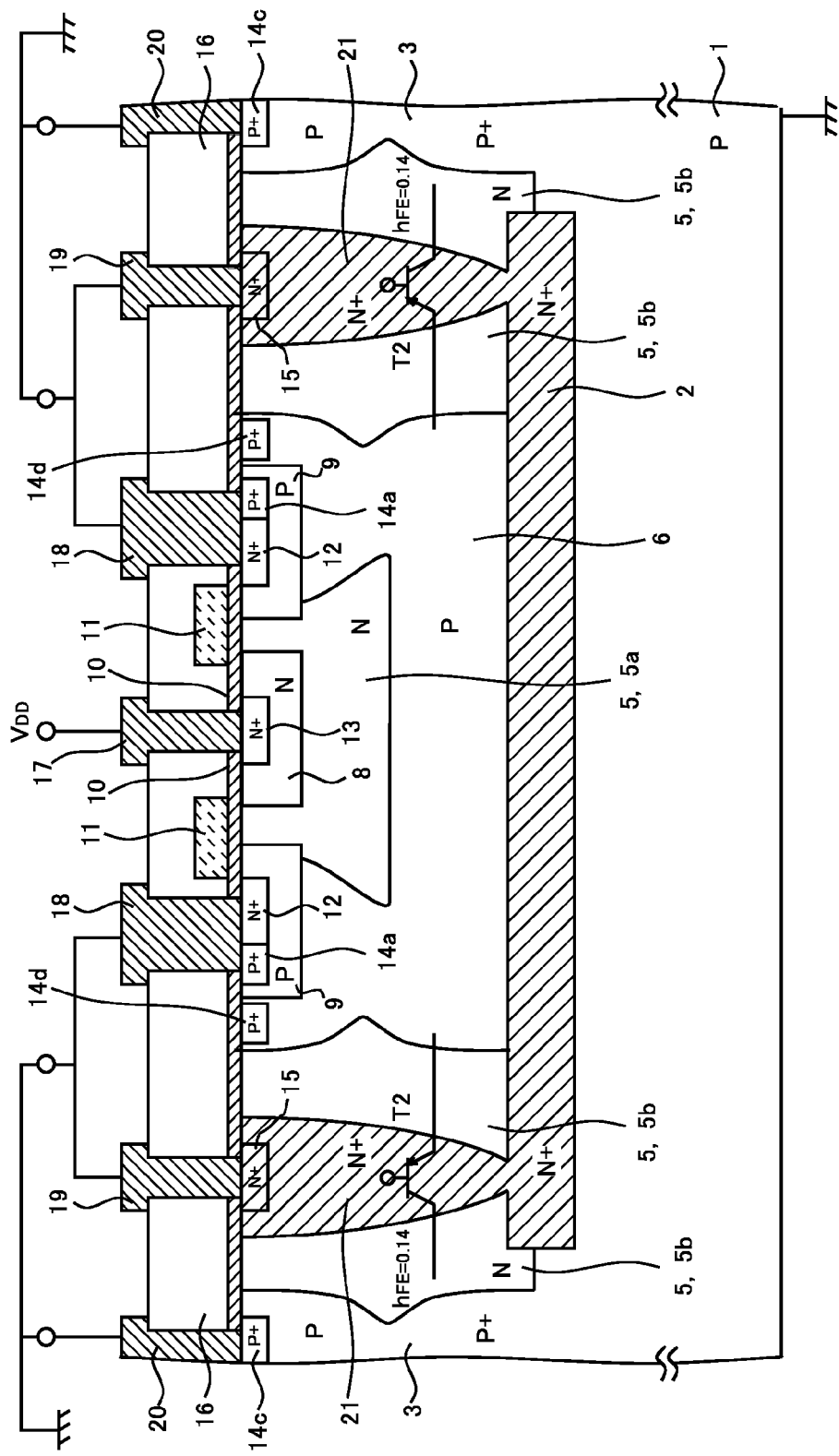
FIG. 2 is a cross-sectional view showing a conventional drain isolated type LDMOS transistor having an N+ type sinker layer.
Figure 3:
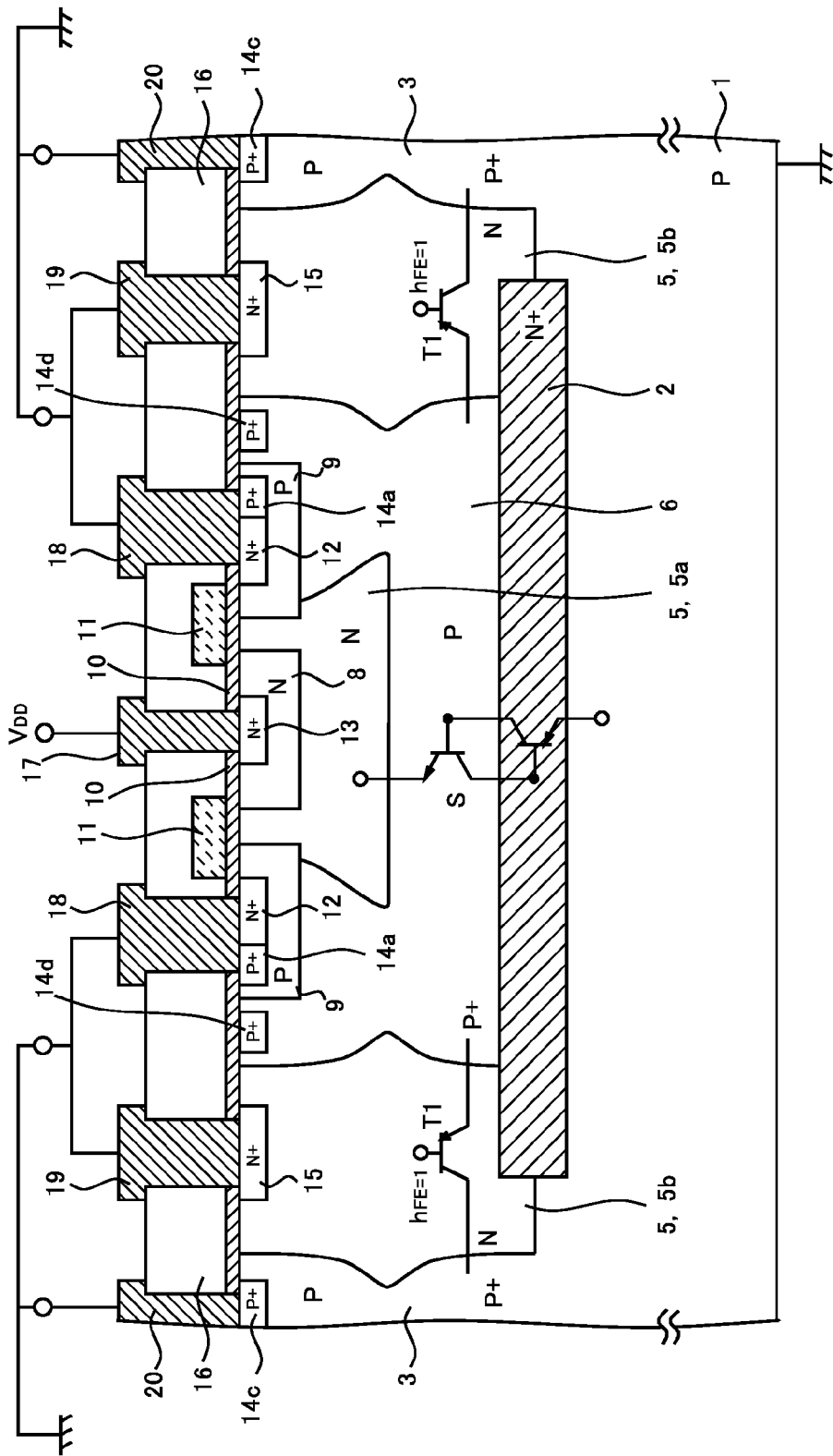
FIG. 3 is a cross-sectional view showing a conventional drain isolated type LDMOS transistor having an N+ type guard ring layer only.

This improvement is understood by comparing this with drain isolated type LDMOS transistors having the described structure shown in FIGS. 2 and 3. FIG. 2 is a drain isolated type LDMOS transistor in which an N+ type sinker layer 21 is formed in the N type layer 5b. FIG. 3 is a drain isolated type LDMOS transistor in which only the N+ type guard ring layer 15 is formed in the N type layer 5b. The other components are the same as those of FIG. 1 and given the same numbers and symbols.

In the case of FIG. 2, the base of the parasitic PNP bipolar transistor T2 is the high impurity concentration N+ type sinker layer 21. Therefore, the base resistance is low, the emitter-base forward voltage is difficult to increase, and a current that flows into the P type semiconductor substrate 1 through the P type element isolation layer 3 as the collector layer is small.

In the case of FIG. 3, the base of the parasitic PNP bipolar transistor T1 is the low impurity concentration N type layer 5b. Therefore, the base resistance is high, and the emitter-base forward voltage is also high. As the increase amount of the potential of the P type drain isolation layer 6 is larger, a current that flows toward the P type semiconductor substrate 1 through the parasitic PNP bipolar transistor T1 increases.

Figure 4A:
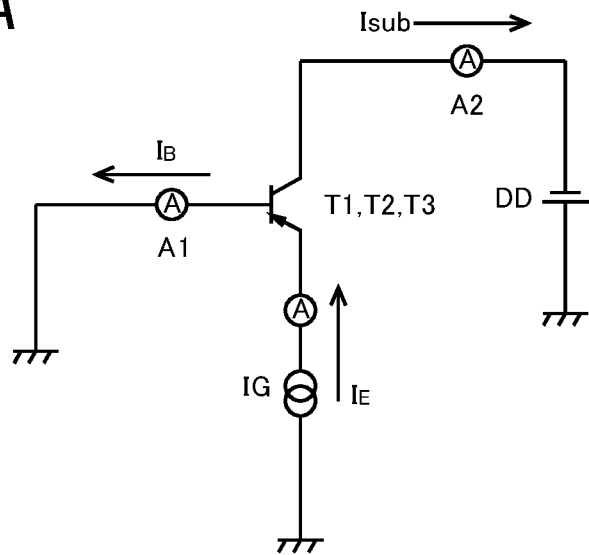
FIGS. 4A and 4B are a diagram showing a method of measuring current amplification factors ($h_{FE}$) of parasitic PNP bipolar transistors of the drain isolated type LDMOS transistors and a graph comparing the current amplification factors ($h_{FE}$) of the parasitic PNP bipolar transistors having different structures.

Measurement is performed for a base current $I_B$ and a collector current $I_{SUB}$ that flow through each of the parasitic PNP bipolar transistors T1, T2 and T3 by giving the bias state as shown in FIG. 4A, and the current amplification factors $h_{FE}=I_{SUB}/I_B$ of the parasitic bipolar transistors are obtained and compared. This is to compare the performances of the parasitic PNP bipolar transistors simply.

A flow of current $I_E$ is given to the P type drain isolation layer 6 as the emitter from a constant-current source IG shown in FIG. 4A through the P+ type drain isolation contact layer 14d shown in FIGS. 1 to 3. The N type layer 5b as the base is grounded through an ammeter A1. A power supply DD is provided to the P type element isolation layer 3 as the collector through an ammeter A2 so as to apply a negative voltage relative to the ground line (negative potential relative to the base).

Figure 4B:
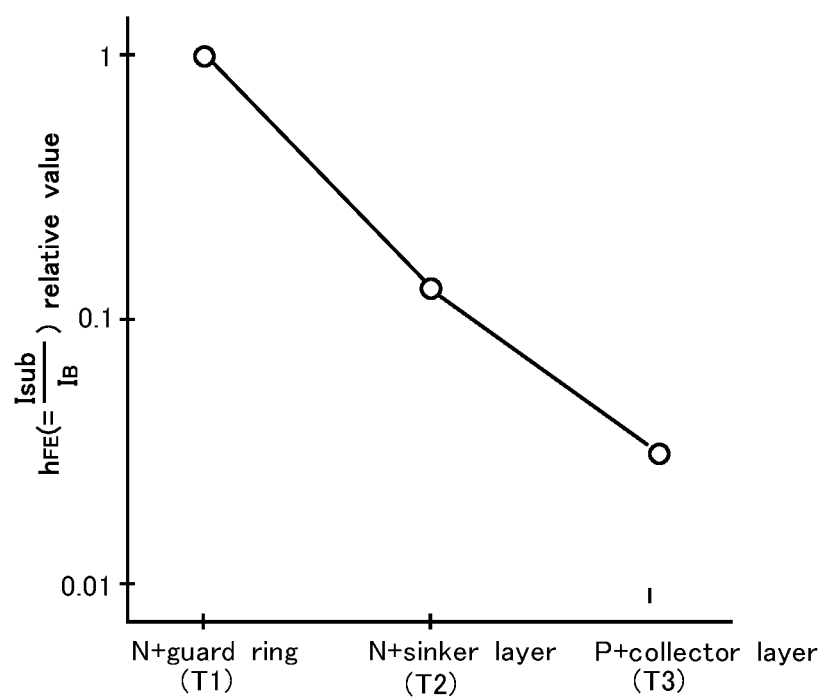

FIG. 4B shows relative values of $h_{FE}$ of the parasitic PNP bipolar transistors T1, T2 and T3 measured in this manner. The relative values are obtained by determining $h_{FE}=1$ in the parasitic PNP bipolar transistor T1 having only the N+ type guard ring 15. It is understood that $h_{FE}$ of the parasitic PNP bipolar transistor T2 using the N+ type sinker layer 21 is smaller than the case using only the N+ type guard ring 15 by about one digit to make a current flow more difficult.

On the other hand, it is understood that $h_{FE}$ of the parasitic PNP bipolar transistor T3 of the first embodiment is further smaller than the parasitic PNP bipolar transistor T2 using the N+ type sinker layer 21 by almost one digit to make a current flow still more difficult in the parasitic PNP bipolar transistor T3. This is because introducing the P type collector layer 7 to form the parasitic PNP bipolar transistor T4 in the first embodiment makes most of a current flow from the P type drain isolation layer 6 having increased potential into the P type collector layer 7 of the parasitic PNP bipolar transistor T4 and run to the ground line.

As a result, compared with the conventional transistors, the first embodiment largely decreases a current flowing from the P type drain isolation layer 6 into the P type semiconductor substrate 1 through the parasitic PNP bipolar transistor T3 that uses the P type drain isolation layer 6 as the emitter, the N type layer 5b as the base, and the P type element isolation layer 3 and the P type semiconductor substrate 1 as the collector when a large positive voltage is applied to the N+ type drain layer 13.

Figure 5A:
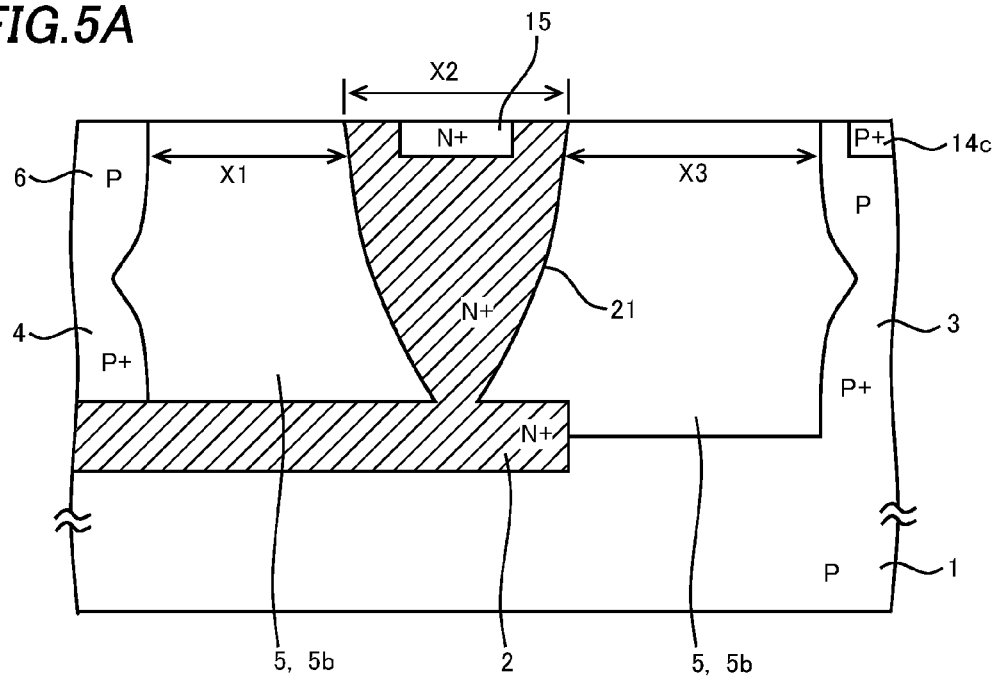
FIGS. 5A and 5B are cross-sectional views of the drain isolated type LDMOS transistors for comparing the influences of the parasitic PNP bipolar transistor regions having different structures on the die sizes.
Figure 5B:
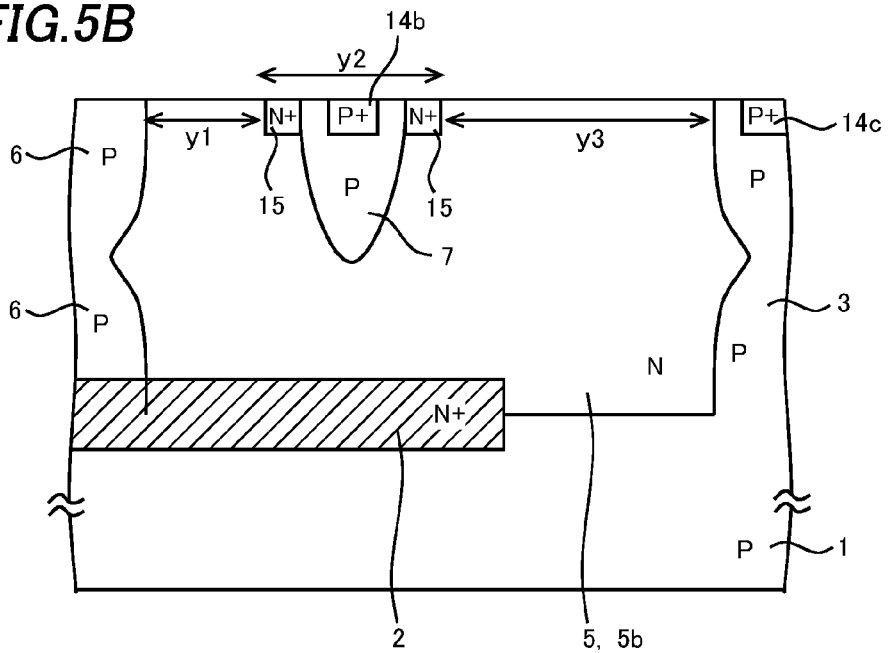

Next, the reduced die size of the drain isolated type LDMOS transistor of the first embodiment will be described hereafter referring to FIGS. 5A and 5B, compared with the die size of the drain isolated type LDMOS transistor using the N+ type sinker layer 21 shown in FIG. 2. FIG. 5A is a schematic cross-sectional view of the N type layer 5b and therearound of the drain isolated type LDMOS transistor using the N+ type sinker layer 21, and FIG. 5B is a cross-sectional view of the same portion of the drain isolated type LDMOS transistor using the P type collector layer 7 of the first embodiment.

A distance y1 of the first embodiment shown in FIG. 5B is determined from a necessary dielectric breakdown voltage between the P type drain isolation layer 6 and the N+ type guard ring layer 15. Since the N+ type guard ring layer 15 is formed by ion implantation of arsenic (As) or the like, almost all the arsenic (As) is distributed in the shape shown in FIG. 5B. Therefore, the distance y1 is a distance that satisfies the dielectric breakdown voltage mentioned above.

A distance y3 is determined from dielectric breakdown voltages between the N+ type guard ring 15 and the P type element isolation layer 3 and between the N+ type buried layer 2 and the P type element isolation layer 3. Since the N+ type guard ring 15 is formed by ion implantation of heavy atoms such as arsenic (As) or the like as described above, the shape shown in FIG. 5B is an end portion of the distribution of the N+ type guard ring. Therefore, the distance y3 is a distance that satisfies the dielectric breakdown voltage mentioned above.

A distance y2 is determined from the depth of the P type collector layer 7 by ion implantation or the like and the width of the N+ type guard ring 15. The depth of the P type collector layer 7 by ion implantation or the like highly contributes to the determination. However, since the surface concentration of the P type collector layer 7 is lower enough than the concentration of the N+ type guard ring 15, the P type collector layer 7 can utilize all the width of the N+ type guard ring 15. Therefore, the P type collector layer 7 can be extended in the N type layer 5b deep utilizing all the width of the N+ type guard ring 15.

x1 of the drain isolated type LDMOS transistor using the N+ type sinker layer 21 shown in FIG. 5A is determined from a dielectric breakdown voltage between the P type drain isolation layer 6 and the N+ type sinker layer 21, in the similar manner to the first embodiment. In FIG. 5A, the N+ type sinker layer 21 is shown as a relatively high concentration region as the boundary that has an effect of decreasing the base concentration of the parasitic PNP bipolar transistor T2 described above.

On the outside of the N+ type sinker layer 21 shown in FIG. 5A, there exists the N+ type sinker layer 21 (not shown) having impurity concentration associated with the dielectric breakdown voltage of the PN junction with the P type drain isolation layer 6. Therefore, it is necessary to determine the distance x1 by allowing a margin for that amount and to provide the distance x1 with a larger value than y1 of the case of FIG. 5B.

A distance x2 cannot avoid being set at a larger value than y2. This is because it is necessary to extend the high concentration N+ type sinker layer 21 to inside the N+ type buried layer 2 through the N type layer 5b and the lateral diffusion cannot avoid being wide. It is necessary to further increase the impurity concentration in order to decrease the base resistance, and the lateral diffusion increases by that amount. A distance x3 need have a value that satisfies a dielectric breakdown voltage between the N+ type sinker layer 21 and the P type element isolation layer 3. In this case, too, the distance x3 need be set at a larger value than y3 for the same reason described about x1.

As an example, the width (y1+y2+y3=y) of the N type layer 5b of the drain isolated type LDMOS transistor of the first embodiment is decreased to a smaller value than 70% of the width (x1+x2+x3=x) of the N type layer 5b using the N+ type sinker layer 21.

Figure 6:
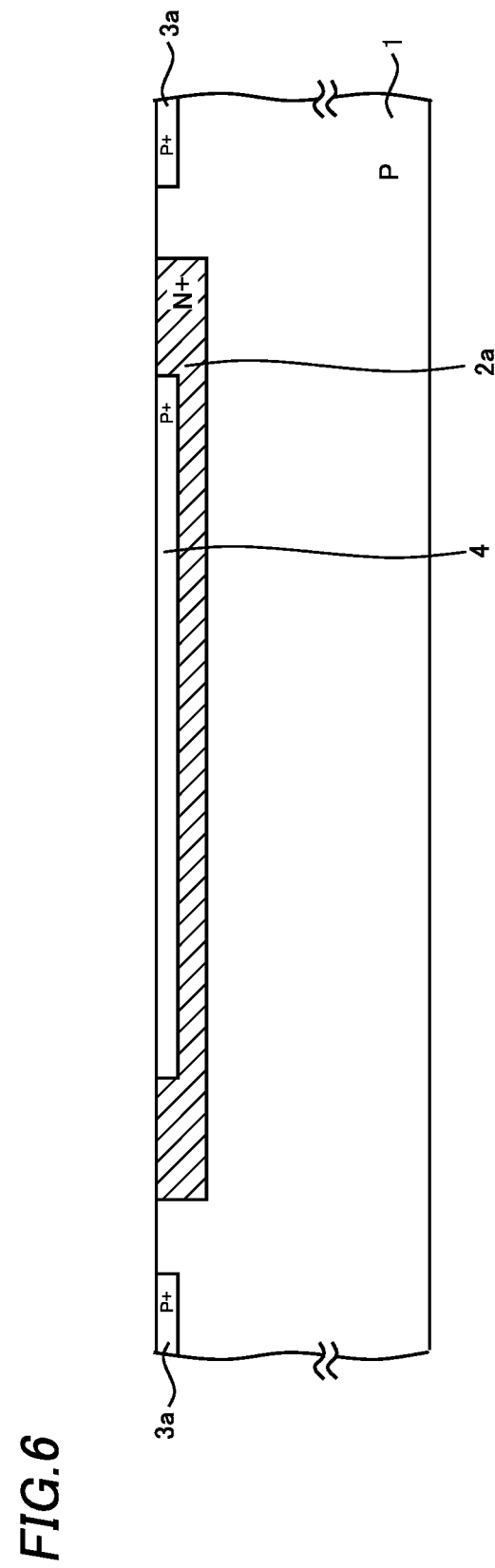
FIGS. 6 to 8 are cross-sectional views showing a method of manufacturing the drain isolated type LDMOS transistor of the first embodiment of the invention.

Next, a method of manufacturing the drain isolated type LDMOS transistor of the first embodiment will be described hereafter referring to FIG. 1 and FIGS. 6 to 8 showing cross-sectional views thereof. First, the P type semiconductor substrate 1 is provided as shown in FIG. 6, an N+ type buried layer 2a made of antimony (Sb) or the like is formed in a predetermined region of the P type semiconductor substrate 1 by a predetermined method. A P+ type buried layer 4 made of boron (B) is then foamed in the front surface of the N+ type buried layer 2a by a predetermined ion implantation method or the like. At the same time, P+ type element isolation deposition layers 3a made of boron (B) are formed in a region where the P type isolation layers 3 are to be formed.

Figure 7:
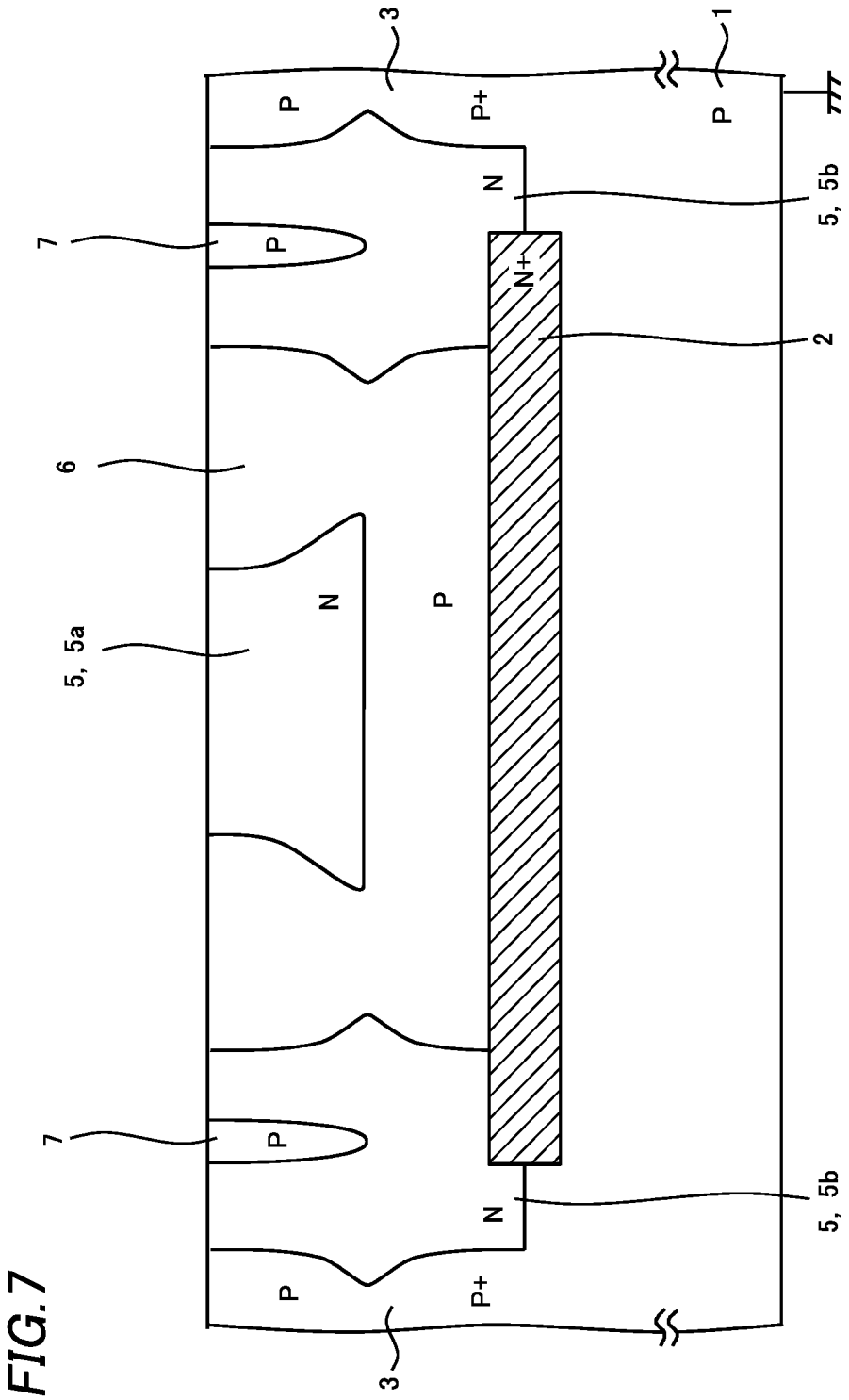

Then, as shown in FIG. 7, the N type epitaxial layer 5 is deposited on the P type semiconductor substrate 1 including on the N+ type buried layer 2 etc by a predetermined epitaxial method. At this time, the N+ type buried layer 2, the P+ type buried layer 4 and the P+ type element isolation deposition layers 3a are diffused upward in the N type epitaxial layer 5 toward the front surface thereof.

The diffusion amount of the P+ type element isolation deposition layers 3a and the P+ type buried layer 4 is larger than the diffusion amount of the N+ type buried layer 2 made of antimony (Sb) or the like of which the diffusion coefficient is small. At the same time, the N+ type buried layer 2, the P+ type buried layer 4 and the P+ type element isolation deposition layers 3a are also diffused in the P type semiconductor substrate 1.

Boron (B) or the like is then implanted in a predetermined region of the front surface of the N type epitaxial layer 5 by ion implantation or the like to form the P type collector layer 7, the P type drain isolation layer 6 combined with the diffusion layer extended upward from the lower P+ type buried layer 4, and the plurality of P type element isolation layers 3 combined with the diffusion layer extended upward from the lower P+ type isolation deposition layer 3a. The P type collector layer 7 has a structure of surrounding the P type drain isolation layer 6 surrounding the N type layer 5a.

The N type epitaxial layer 5 between the P type element isolation layer 3 and the P type drain isolation layer 6 forms the N type layer 5b. The P type collector layer 7 is formed extending from the front surface of the N type layer 5b to the middle therein. Furthermore, a partial region of the N type epitaxial layer 5 remains surrounded by the P type drain isolation layer 6, forming the N type layer 5a. The P type drain isolation layer 6 has a structure of overlapping the N+ type buried layer 2 except the both end regions of the N+ type buried layer 2.

Figure 8:
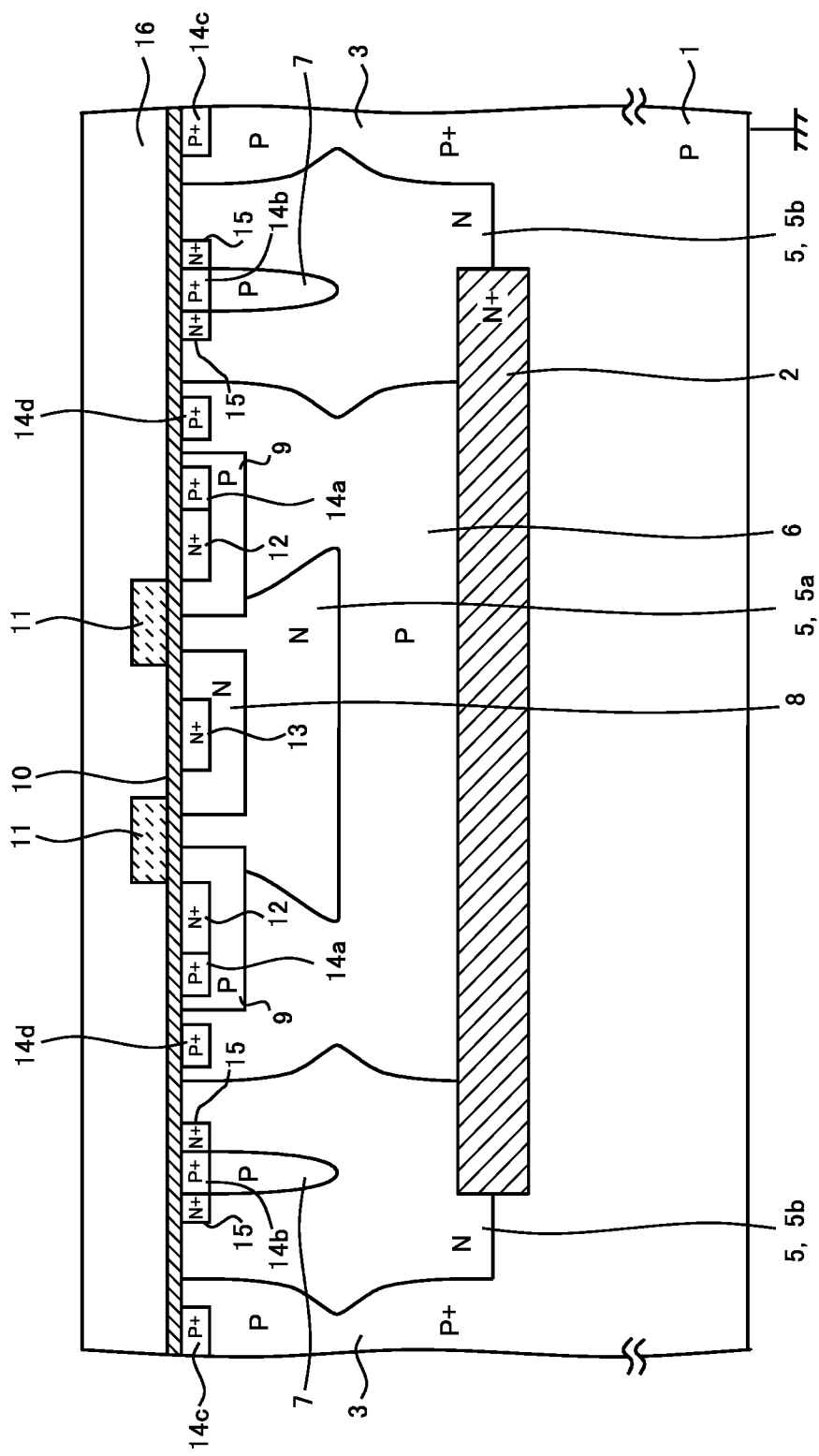

Then, as shown in FIG. 8, phosphorus (P) or the like is ion-implanted from the front surface of the N type layer 5a by a predetermined method to form the N type drift layer 8 in the N type layer 5a. Boron (B) is then ion-implanted in a predetermined region of the P type drain isolation layer 6 to form the P type body layer 9. The gate insulation film 10 is then formed on the P type semiconductor substrate 1 where the P type body layer 9 etc are formed, and the gate electrode 11 is formed on the gate insulation film 10, extending from on the N type drift layer 8 onto the P type body layer 9.

Arsenic (As) is then ion-implanted using the gate electrode 11 etc as a mask to form the N+ type source layer 12 in the P type body layer 9. At the same time, the N+ type drain layer 13 is foamed in the N type drift layer 8, and the N+ type guard ring layer 15 is formed in the N type layer 5b on the both sides of the P type collector layer 7.

Boron (B) or the like is then ion-implanted by a predetermined method to form the P+ type contact layer 14a in the P type body layer 9, the P+ type collector layer 14b in the P type collector layer 7, the P+ type drain isolation layer 14d in the P type drain isolation layer 6, and the P+ type isolation layer 14c in the P type element isolation layer 3. Then a predetermined treatment is performed thereto, and the interlayer insulation film 16 is formed by a predetermined CVD method or the like.

Then, as shown in FIG. 1, contact holes are formed in the interlayer insulation film 16 etc by a predetermined photo-etching process, and then a metal film mainly made of aluminum (Al) is deposited on the whole surface of the P type semiconductor substrate 1 including in the contact holes by a sputtering method or the like. Alternatively, the metal film may be formed by sputtering after silicide is formed on the N+ type drain layer 13 etc by a predetermined method.

Then, by a predetermined photo-etching process, the drain electrode 17 connected to the N+ type drain layer 13, the source electrode 18 connected to the N+ type source layer 12 and the P+ type contact layer 14a, the collector electrode 19 connected to the P+ type collector layer 14b and the N+ type guard ring 15, and the isolation electrode 20 connected to the P+ type isolation layer 14c respectively through the contact holes are formed. It is noted that the source electrode 18, the collector electrode 19 and the isolation electrode 20 are connected through electrodes made of aluminum (Al) or the like.

Then, after a multilayer wiring structure is formed according to need, a passivation film made of a silicon nitride film or the like is formed, and then a predetermined photo-etching process is performed, thereby completing the LDMOS transistor.

Figure 9:
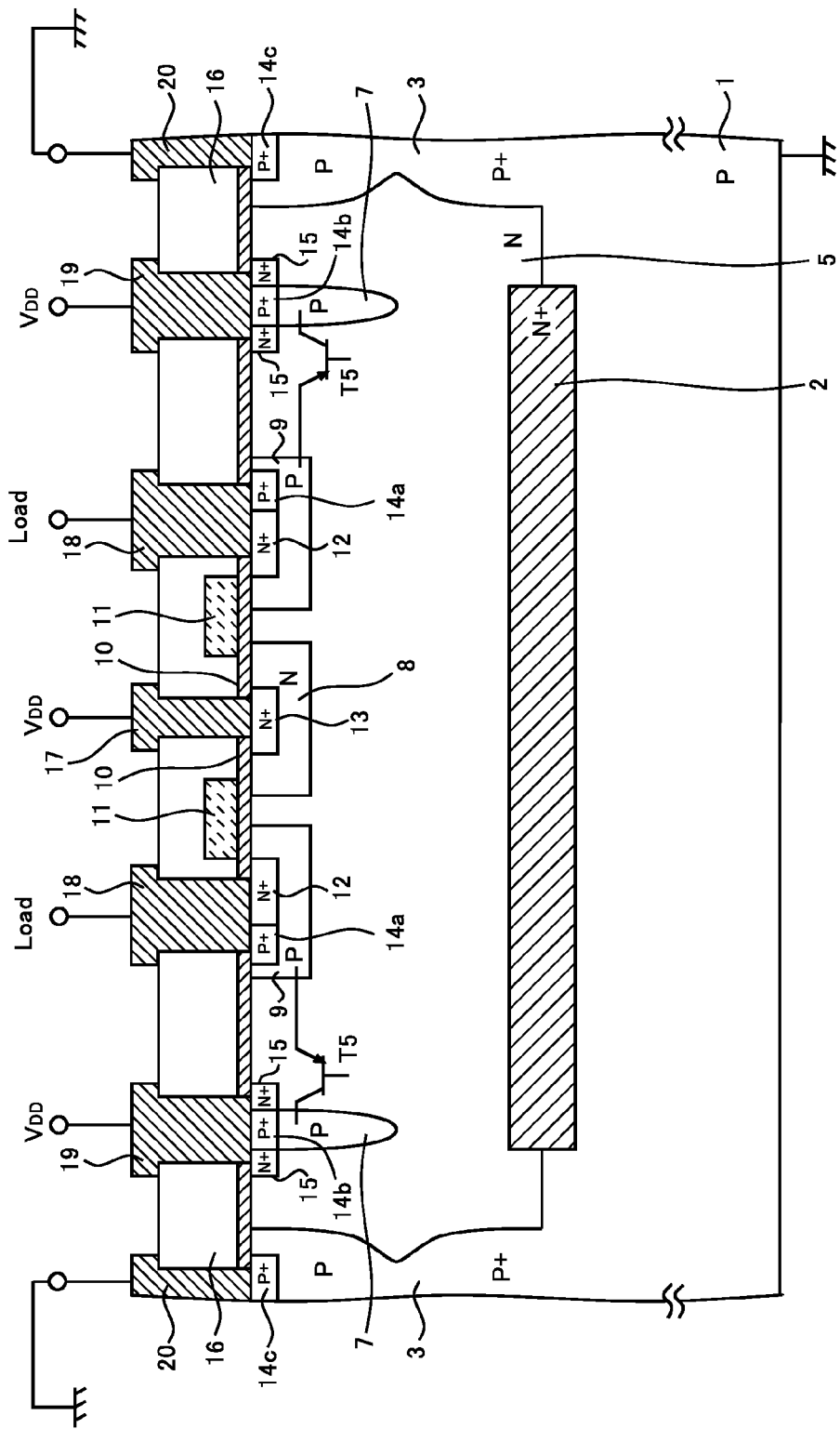
FIG. 9 is a cross-sectional view showing an ordinary type LDMOS transistor of a second embodiment of the invention.

A second embodiment will be described hereafter referring to FIG. 9. The second embodiment is to decrease a regenerative current of an ordinary type LDMOS transistor. FIG. 11A is a schematic plan view of this LDMOS transistor, and FIG. 9 shows a cross-sectional structure thereof along line B-B. FIG. 9 is such that the P type drain isolation layer 6 and the P+ type drain isolation contact layer 14d are eliminated from the cross-sectional structure of the drain isolated type LDMOS transistor shown in FIG. 1, and the same symbols and numbers are given to the same components as those in FIG. 1.

When a large positive voltage is applied to the source electrode 18 from an L load when the power supply turns off or the like, a surge current flows from the forward-biased PN junction formed by the N type epitaxial layer 5 and P type body layer 9 into the power supply line $V_{DD}$ through the N+ type drain layer 13 and the drain electrode 17.

Furthermore, a parasitic PNP bipolar transistor (not shown) that uses the P type body layer 9 as the emitter, the N type epitaxial layer 5 as the base, and the P type semiconductor substrate 1 as the collector also turns to the on-state operation state.

Furthermore, since the potential of the P type body layer 9 becomes higher than the potential of the N type epitaxial layer 5, a parasitic PNP bipolar transistor T5 that uses the P type body layer 9 as the emitter, the N type epitaxial layer 5 as the base, and the P type collector layer 7 as the collector, shown in FIG. 9, turns to the on-state operation state, and a surge current flows to the power supply line $V_{DD}$ through the P+ type collector layer 14b and the collector electrode 19.

At this time, since most of the surge current flows in the parasitic PNP bipolar transistor T5 that has a shorter current path and smaller resistance, the surge current flowing into the P type semiconductor substrate 1 through the parasitic PNP bipolar transistor (not shown) is decreased.

A method of manufacturing the ordinary type LDMOS transistor of the second embodiment is such that the process of forming the P type drain isolation layer 6 is eliminated from the method of manufacturing the drain isolated type LDMOS transistor, and the other processes are the same as those in the first embodiment.

Figure 10:
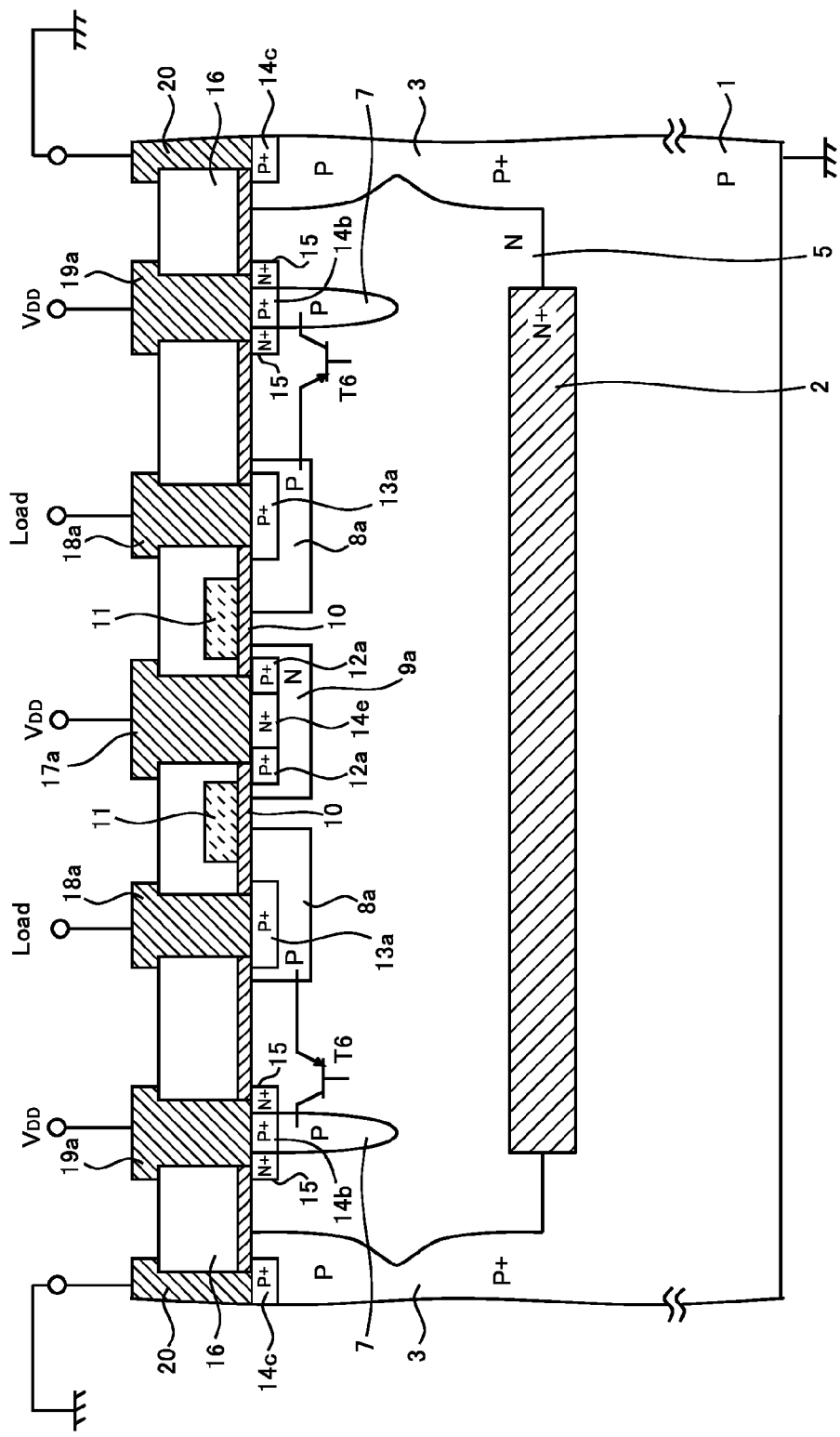
FIG. 10 is a cross-sectional view showing an ordinary type LDMOS transistor of a third embodiment of the invention.
Figure 11B:
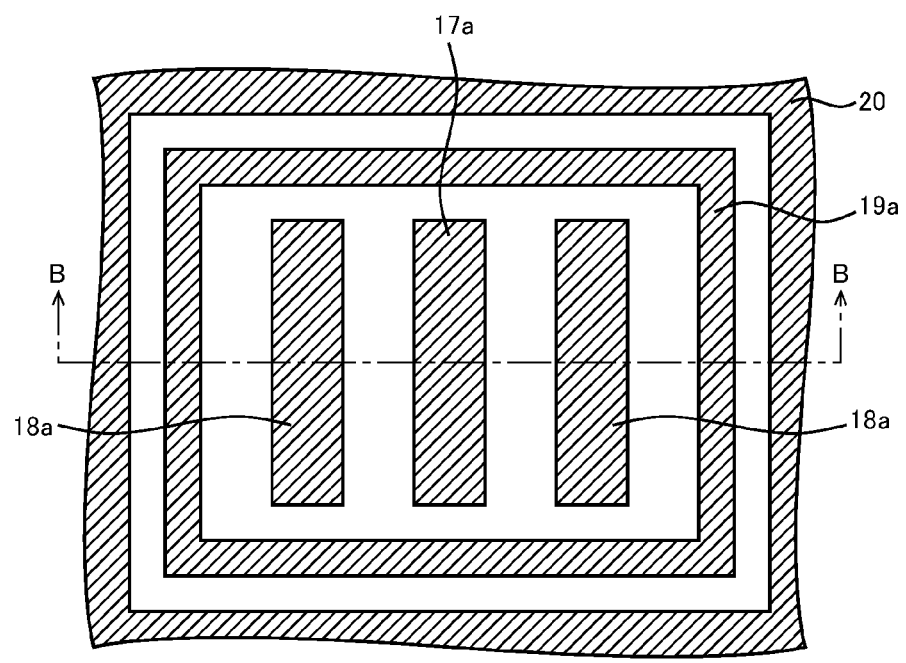

A third embodiment will be described hereafter referring to FIG. 10. The third embodiment also relates to an ordinary type LDMOS transistor, like in the case of the second embodiment. FIG. 11B is a schematic plan view of this LDMOS transistor, and FIG. 10 shows a cross-sectional structure thereof along line B-B. The third embodiment differs from the second embodiment in that the third embodiment employs a P channel type ordinary type LDMOS transistor while the second embodiment employs an N channel type ordinary type LDMOS transistor.

Therefore, the difference is that the drain region including the N+ type drain layer 13 is formed at the center and the source region including the N+ type source layer 12 is formed on the left and right sides of the drain region in the second embodiment while the source region including a P+ type source layer 12a is formed at the center and the drain region including a P+ type drain layer 13a is formed on the left and right sides of the source region in the third embodiment.

The symbols given to the components of the source region and the drain region are such that a is given to the numerals of the components in FIG. 9 so as to correspond to the components in FIG. 9. For example, the N+ type source layer 12 in FIG. 9 corresponds to the P+ type source layer 12a in FIG. 10. The P+ type contact layer 14a is shown as an N+ type contact layer 14e. The other components are given the same numerals.

When a large positive voltage is applied to a drain electrode 18a of the P channel type ordinary type LDMOS transistor like in the second embodiment, the PN junction between the N type epitaxial layer 5 and a P type drift layer 8a is forward-biased. Therefore, a surge current flows from a source electrode 17a to the power supply line $V_{DD}$ through the N type body layer 9a and the N+ type contact layer 14e.

Furthermore, a parasitic PNP bipolar transistor T6 that uses the P type drift layer 8*a* as the emitter, the N type epitaxial layer 5 as the base, and the P type collector layer 7 as the collector also turns to the on-state operation state, and a surge current flows into the power supply line $V_{DD}$ through the collector electrode 19*a*.

At this time, like in the second embodiment, a parasitic PNP bipolar transistor (not shown) that uses the P type drift layer 8*a* as the emitter, the N type epitaxial layer 5 as the base, and the P type semiconductor substrate 1 as the collector also turns to the on-state operation state. However, a current flowing into the P type semiconductor substrate 1 through this parasitic PNP bipolar transistor is small, like in the second embodiment.

The P channel type ordinary type LDMOS transistor of the third embodiment is such that the N type of the N channel type LDMOS transistor of the second embodiment is only changed to the P type, and manufactured by a similar method to the method of the second embodiment. It is noted that the P type collector layer 7 is formed by the same method as that of the second embodiment.

The P type collector layer 7 has a structure as a feature of the invention, which decreases a surge current flowing into the P type semiconductor substrate 1 in the ordinary type LDMOS transistors in both the second and third embodiments.

A semiconductor device of the invention largely decreases a regenerative current or a current of a parasitic bipolar transistor that flows from a drain layer of an LDMOS transistor to the semiconductor substrate without increase in the die size.

What is claimed is:

1. A semiconductor device comprising:
    a semiconductor substrate of a first general conductivity type;
    an epitaxial layer of a second general conductivity type formed on the semiconductor substrate;
    a buried layer of the second general conductivity type formed in a boundary region between the semiconductor substrate and the epitaxial layer;
    a drift layer of the second general conductivity type formed in a surface portion of the epitaxial layer;
    an element isolation layer of the first general conductivity type formed in the epitaxial layer so as to surround the drift layer;
    a drain layer of the second general conductivity type formed in a surface portion of the drift layer and connected to a drain electrode of the semiconductor device;
    a drain isolation layer of the first general conductivity type formed in the epitaxial layer so as to surround the drift layer and the drain layer;
    a hole collection layer of the first general conductivity type connected to a collector electrode of the semiconductor device and formed in a surface portion of the epitaxial layer that is between the drain isolation layer and the element isolation layer;
    a guard ring layer of the second general conductivity type formed in a surface portion of the epitaxial layer so as to be in direct contact with and surrounding an upper portion of the hole collection layer at a surface of the epitaxial layer, wherein the hole collection layer extends into the epitaxial layer below the guard ring layer, the element isolation layer surrounding the epitaxial layer containing the guard ring layer;
    a body layer of the first general conductivity type formed in a surface portion of the epitaxial layer;
    a source layer of the second general conductivity type formed in a surface portion of the body layer;
    a gate insulation film formed on a surface portion of the body layer; and
    a gate electrode of the semiconductor device formed on the gate insulation film.

2. The semiconductor device of claim 1, wherein the hole collection layer is shallower than the epitaxial layer.

3. The semiconductor device of claim 1, wherein the drain layer is connected to a power supply potential, and the source layer, the hole collection layer, the element isolation layer and the semiconductor substrate are connected to a ground potential.

4. The semiconductor device of claim 1, wherein the hole collection layer is disposed in the epitaxial layer of the second general conductivity type.

5. The semiconductor device of claim 1, further comprising a drain isolation contact layer of the first general conductivity type, which is disposed in the drain isolation layer.

6. The semiconductor device of claim 1, further comprising:
    a contact layer of the first general conductivity type formed in the body layer and in direct contact with the source layer; and
    a source electrode connected to both the contact layer and the source layer.

7. A semiconductor device comprising:
    a semiconductor substrate of a first general conductivity type;
    an epitaxial layer of a second general conductivity type formed on the semiconductor substrate;
    a buried layer of the second general conductivity type formed in a boundary region between the semiconductor substrate and the epitaxial layer;
    a drift layer of the second general conductivity type formed in a surface portion of the epitaxial layer;
    an element isolation layer of the first general conductivity type formed in the epitaxial layer so as to surround the drift layer;
    a drain layer of the second general conductivity type connected to a drain electrode of the semiconductor device and formed in a surface portion of the drift layer;
    a hole collection layer of the first general conductivity type connected to a collector electrode of the semiconductor device and formed in a surface portion of the epitaxial layer that is between the drift layer and the element isolation layer, the hole collection layer being disposed in the epitaxial layer of the second general conductivity type;
    a guard ring layer of the second general conductivity type formed in a surface portion of the epitaxial layer so as to be in direct contact with and surrounding an upper portion of the hole collection layer at a surface of the epitaxial layer, wherein the hole collection layer extends into the epitaxial layer below the guard ring layer, the element isolation layer surrounding the guard ring layer;
    a body layer of the first general conductivity type formed in a surface portion of the epitaxial layer;
    a source layer of the second general conductivity type formed in a surface portion of the body layer;
    a gate insulation film formed on a surface portion of the body layer; and
    a gate electrode of the semiconductor device formed on the gate insulation film.

8. The semiconductor device of claim 7, wherein the hole collection layer is shallower than the epitaxial layer.

9. The semiconductor device of claim 7, wherein the drain layer and the hole collection layer are connected to a power supply potential, and the semiconductor substrate is connected to a ground potential.

10. The semiconductor device of claim 7, wherein a top surface of the buried layer is in contact only with the epitaxial layer of the second general conductivity type.

11. The semiconductor device of claim 7, further comprising:
   a contact layer of the first general conductivity type formed in the body layer and in direct contact with the source layer; and
   a source electrode connected to both the contact layer and the source layer.

12. A semiconductor device comprising:
   a semiconductor substrate of a first general conductivity type;
   an epitaxial layer of a second general conductivity type formed on the semiconductor substrate;
   a buried layer of the second general conductivity type formed in a boundary region between the semiconductor substrate and the epitaxial layer;
   a drift layer of the first general conductivity type formed in a surface portion of the epitaxial layer;
   an element isolation layer of the first general conductivity type formed in the epitaxial layer so as to surround the drift layer;
   a drain layer of the first general conductivity type formed in a surface portion of the drift layer and connected to a drain electrode of the semiconductor device;
   a hole collection layer of the first general conductivity type connected to a collector electrode of the semiconductor device and formed in a surface portion of the epitaxial layer that is between the drift layer and the element isolation layer;
   a guard ring layer of the second general conductivity type formed in a surface portion of the epitaxial layer so as to be in direct contact with and surrounding an upper portion of the hole collection layer at a surface of the epitaxial layer, wherein the hole collection layer extends into the epitaxial layer below the guard ring layer, the element isolation layer surrounding the epitaxial layer containing the guard ring layer;
   a body layer of the second general conductivity type formed in a surface portion of the epitaxial layer, and being parallel with the drift layer, the body layer not being formed between the drift layer and the collector layer;
   a source layer of the first general conductivity type formed in a surface portion of the body layer; a gate insulation film formed on a surface portion of the body layer; and
   a gate electrode of the semiconductor device formed on the gate insulation film.

13. The semiconductor device of claim 12, wherein the hole collection layer is shallower than the epitaxial layer.

14. The semiconductor device of claim 12, wherein the source layer and the hole collection layer are connected to a power supply potential, and the semiconductor substrate is connected to a ground potential.

15. A method of forming a semiconductor device comprising:
   forming a semiconductor substrate of a first general conductivity type;
   forming an epitaxial layer of a second general conductivity type on the semiconductor substrate;
   forming a buried layer of the second general conductivity type in a boundary region between the semiconductor substrate and the epitaxial layer;
   forming a drift layer of the second general conductivity type in a surface portion of the epitaxial layer;
   forming an element isolation layer of the first general conductivity type in the epitaxial layer so as to surround the drift layer;
   forming a drain layer of the second general conductivity type in a surface portion of the drift layer and connected to a drain terminal of the semiconductor device;
   forming a drain isolation layer of the first general conductivity type in the epitaxial layer so as to surround the drift layer and the drain layer;
   forming a hole collection layer of the first general conductivity type in a surface portion of the epitaxial layer that is between the drain isolation layer and the element isolation layer, wherein the hole collection layer is connected to a collector terminal of the semiconductor device;
   forming a guard ring layer of the second general conductivity type in a surface portion of the epitaxial layer so as to be in direct contact with and surrounding an upper portion of the hole collection layer at a surface of the epitaxial layer, wherein the hole collection layer extends into the epitaxial layer below the guard ring layer, the element isolation layer surrounding the epitaxial layer containing the guard ring layer;
   forming a body layer of the first general conductivity type in a surface portion of the epitaxial layer;
   forming a source layer of the second general conductivity type in a surface portion of the body layer;
   forming a gate insulation film on a surface portion of the body layer; and
   forming a gate electrode of the semiconductor device on the gate insulation film.

16. The method of claim 15, wherein the hole collection layer is formed shallower than the epitaxial layer.

17. The method of claim 15, wherein the drain layer is formed connected to a power supply potential, and the source layer, the hole collection layer, the element isolation layer and the semiconductor substrate are connected to a ground potential.

18. The method of claim 15, wherein forming the hole collection layer comprises forming the hole collector layer in the epitaxial layer of the second general conductivity type.

19. The method of claim 15, further comprising forming a drain isolation contact layer of the first general conductivity type in the drain isolation layer.

20. The method of claim 15, further comprising:
   forming a contact layer of the first general conductivity type formed in the body layer and in direct contact with the source layer; and
   forming a source electrode connected to both the contact layer and the source layer.

* * * * *